United States Patent [19]

Hey

[11] Patent Number: 4,599,187

[45] Date of Patent: Jul. 8, 1986

[54] CLEANING COMPOSITIONS BASED ON TRICHLOROTRIFLUOROETHANE AND ALCOHOLS

[75] Inventor: David G. Hey, Northwich, England

[73] Assignee: Imperial Chemical Industries PLC, London, England

[21] Appl. No.: 471,334

[22] Filed: Mar. 2, 1983

[30] Foreign Application Priority Data

Mar. 18, 1982 [GB] United Kingdom ................. 8207905

[51] Int. Cl.$^4$ .............................................. C11D 3/44
[52] U.S. Cl. ..................................... 252/171; 134/26; 134/40; 252/170; 252/364
[58] Field of Search ............................. 134/38, 26, 40; 252/170, 171, 364

[56] References Cited

U.S. PATENT DOCUMENTS

| | | | |
|---|---|---|---|
| 3,340,199 | 9/1967 | Clay et al. | 252/171 |
| 3,846,327 | 11/1974 | Schofield | 252/170 |
| 3,904,430 | 9/1975 | Tipping et al. | 134/11 |
| 3,988,256 | 10/1976 | Vandermey et al. | 252/171 |
| 4,052,328 | 10/1977 | Figiel | 252/171 |
| 4,260,510 | 4/1981 | Hey et al. | 252/171 |
| 4,269,630 | 5/1981 | Stephenson | 134/26 |
| 4,303,558 | 12/1981 | Hey | 252/548 |

FOREIGN PATENT DOCUMENTS

| | | |
|---|---|---|
| 2032386 | 12/1976 | Fed. Rep. of Germany . |
| 7202687 | 9/1972 | Netherlands . |
| 1307274 | 2/1973 | United Kingdom . |
| 1377156 | 12/1974 | United Kingdom . |
| 2038865 | 7/1980 | United Kingdom . |
| 740822 | 6/1980 | U.S.S.R. . |

Primary Examiner—Prince E. Willis
Attorney, Agent, or Firm—Cushman, Darby & Cushman

[57] ABSTRACT

A cleaning composition suitable for removing ionic flux residues from printed circuit boards comprises an approximate azeotropic mixture of 1,1,2-trichloro-1,2,2-trifluoroethane and an aliphatic alcohol having from 1 to 3 carbon atoms containing as additives and aliphatic alcohol having from 4 to 6 carbon atoms, preferably isobutyl alcohol, and a polyol, preferably ethylene glycol. Contaminated articles are cleaned by bringing them into contact with the cleaning composition which preferably is employed at the boil.

9 Claims, No Drawings

CLEANING COMPOSITIONS BASED ON TRICHLOROTRIFLUOROETHANE AND ALCOHOLS

This invention relates to a cleaning composition comprising 1,1,2-trichloro-1,2,2-triflurorethane and an aliphatic alcohol.

It is well known that constant boiling mixtures (otherwise known as azeotropic mixtures) of 1,1,2-trichloro-1,2,2,-trifluoroethane and methyl alcohol, ethyl alcohol and isopropyl alcohol and mixtures approximating to the azeotropic mixtures are useful for a variety of cleaning purposes for example in the cleaning of printed circuit boards to remove flux residues. However such mixtures are not entirely satisfactory for cleaning printed circuit boards since often they do not remove all the flux residues, especially the ionic residues of the more modern fluxes.

It has been proposed to improve the ability of the above compositions to remove ionic flux residues from printed circuit boards by incorporating a polyol such as diethylene glycol or 1,1,1-tri(hydroxymethyl)propane in the compositions, such an improved composition being described in our United Kingdom Patent Application No. 2,038,865A. These improved compositions are much more effective in removing ionic flux residues than are compositions not containing a polyol, but even these improved compositions may not be entirely satisfactory in that they may leave traces of ionic flux residues on the printed circuit boards.

We have now found that the ability of cleaning compositions comprising the approximate azeotropic mixture of 1,1,2-trichloro-1,2,2-trifluoroethane and an aliphatic alcohol having 1 to 3 carbon atoms to remove ionic flux residues is improved if a monohydric aliphatic alcohol containing from 4 to 6 carbon atoms and a polyol are incorporated in the composition.

According to the present invention we provide a cleaning composition comprising the approximate azeotropic mixture of 1,1,2-trichloro-1,2,2-trifluoroethane and a monohydric lower aliphatic alcohol having from 1 to 3 carbon atoms, and containing as additives a monohydric aliphatic alcohol containing from 4 to 6 carbon atoms and a polyol of formula $C(W)(X)(Y)(Z)$ wherein (W) and (X), which may be the same or different, are each a hydroxyl group, a hydroxyalkyl group or a hydroxyalkoxy group having from 1 to 8 carbon atoms or a hydroxyalkylene group having from 2 to 8 carbon atoms and (Y) and (Z), which may be the same or different, are each a hydroxyalkyl group having from 1 to 8 carbon atoms, a hydroxyalkylene group having from 2 to 8 carbon atoms, hydrogen, an alkyl group having from 1 to 8 carbon atoms, an alkylene group having from 2 to 8 carbon atoms, or a nitro-group.

The preferred aliphatic alcohols containing 4 to 6 carbon atoms are isobutyl alcohol and n-hexanol, isobutyl alcohol being especially preferred. The amount of the $C_{4-6}$ alcohol will usually be from 0.5% to 4% by weight of the composition, typically about 1% to 2% by weight of the composition.

Usually there is employed at least 0.5% by weight of the polyol additive in the present cleaning compositions, for example, 0.5% to 4% by weight of the compositions.

In the polyol, the alkyl chain of the hydroxyalkyl or hydroxyalkoxy group and the alkylene chain of the hydroxyalkylene group preferably contain from 1 to 6 carbon atoms and from 2 to 6 carbon atoms, respectively. The hydroxyalkyl and hydroxyalkylene group may contain more than one hydroxyl group and the hydroxyl group(s) may be attached to any one of the carbon atoms in the alkyl or alkylene chain. Preferably a hydroxyl group is attached to a terminal carbon atom.

When (W) is a hydroxyalkyl group one or more of (X)(Y) and (Z) also is/are suitably a hydroxyalkyl group. Such hydroxyalkyl groups are usually the same as (W), preferably the hydroxymethyl or the 2-hydroxyethyl group.

Typical examples of triols useful as the polyol additive of the present compositions are 1,1,1-tri(hydroxymethyl)-ethane, $CH_3C(CH_2OH)_3$, and 1,1,1-tri(hydroxymethyl)-propane, $CH_3CH_2C(CH_2OH)_3$.

The polyol additive of the composition may be a diol amongst which we prefer those wherein (W) is a hydroxyalkyl group, (X) is a hydroxyl group or a hydroxyalkoxy group and (Y) and (Z) are each hydrogen. Examples of the preferred diol additives are those wherein (W) is a hydroxymethyl group and (X) is a hydroxyl group or a hydroxypropoxy group, that is ethylene glycol and diethylene glycol $(HOCH_2CH_2CH_2CH_2OH)$. Ethylene glycol is the preferred diol.

The polyol additive in the present cleaning composition preferably boils at temperatures above 100° C. and is essentially non-volatile under the conditions of use.

By the term "approximate azeotropic mixture", we mean mixtures which boil within ±2° C. of the boiling point of the azeotropic mixture. Preferably the mixture boils within ±1° C. of the azeotropic mixture.

If desired mixtures of monohydric aliphatic alcohols having 1 to 3 carbon atoms may be used. The aliphatic alcohol of the azeotropic mixture is methyl alcohol, ethyl alcohol, commercially available sources of ethyl alcohol containing, for example, 4% to 5% by weight of methyl alcohol, or n or isopropyl alcohol.

The composition may if desired contain small amounts of other adjuvants, for example a small amount of one or more conventional stabilisers for the mixture of 1,1,2-trichloro-1,2,2-trifluoroethane and the monohydric lower aliphatic alcohol, for instance a small amount of a mononitroalkane, e.g. nitromethane.

The compositions of the present invention may be used in conventional operating techniques. Preferably the composition is employed at the boil. The contaminated article may be immersed in the cleaning composition or jetted with a spray of the cleaning composition. The article after treatment with the cleaning composition is preferably rinsed with a composition containing the trichlorotrifluoroethane and the alcohol having 1 to 3 carbon atoms, suitably the appropriate azeotropic composition which may also contain the additives (i.e. the cleaning composition may also be the rinsing composition).

The composition of the invention are useful for a variety of cleaning purposes, for example in the removal of flux and other contaminants from articles and they are also useful in the removal of water from contaminated articles.

The present invention includes within its scope a process for the preparation of a cleaning composition which comprises incorporating the polyol and the monohydric aliphatic alcohol containing from 4 to 6 carbon atoms, and if desired other additives, into the approximately azeotropic mixture of 1,1,2-trichloro- 1,2,2-trifluoroethane and the monohydric aliphatic alcohol containing from 1 to 3 carbon atoms.

The invention also provides a method of cleaning contaminated articles which comprises bringing the articles into contact with a cleaning composition as hereinbefore described.

The invention is illustrated but in no way limited by the following Examples:

EXAMPLE 1

A conventional stainless steel degreasing unit was employed having a cleaning compartment and a rinsing compartment and a condenser running round the upper portion of the walls of the unit. The cleaning and rinsing compartments were both 25 cms long by 15 cms wide. Into the cleaning compartment was placed to a depth of 10 cms a cleaning composition comprising a mixture of 1,1,2-trichloro 1,2,2-trifluoroethane (93.45%), industrial ethyl alcohol (4.5%), isobutyl alcohol (1.0%), ethylene glycol (1.0%) and nitromethane (0.05%).

Into the rinsing compartment the same composition was placed to a depth of 20 cms. The composition in both compartments was heated to boiling, the vapours were condensed and the condensate was fed to the rinsing compartment. There was an overflow of composition from the rinsing to the cleaning compartment so that the isobutyl alcohol and the polyol additive were progressively removed from the rinsing compartment and passed to the cleaning compartment.

Dry printed circuit boards (approximate size 5 cms by 2.5 cms) having a substrate of epoxy resin glass mat laminate and contaminated with an ionic flux known as Fry's R8 flux were dipped for periods of from 0.5 minute to 1 minute firstly in the cleaning compartment and then in the rinsing compartment.

The plant was run and used to clean printed circuit boards for a continuous period of 160 hours. Each morning the composition in the cleaning compartment was topped up to a fixed level with fresh cleaning composition. During the course of the run samples of the compositions in the cleaning and rinsing compartments were withdrawn at intervals of time (see Table 1 below) and the compositions were analysed.

It was observed that throughout the run printed circuit boards were cleaned effectively and displayed no visible traces of contamination. In order to assess the cleanliness of the boards and in particular to assess their freedom from ionic flux residues, cleaned boards were tested in an Omega meter (available from Kenco), the test involving immersing the boards in a mixture of isopropyl alcohol and water to remove ionic residues from the boards, and measuring the conductivity of the liquid. The results, expressed as equivalent milligrams per square inch of sodium chloride on the boards being tested, are shown in Table 2.

For purposes of comparison, the plant was used to clean a sample of the same printed circuit boards using the azeotropic mixture of 1,1,2-trichloro-1,2,2-trifluoroethane and industrial ethyl alcohol in both the cleaning and rinsing compartments. The resulting boards were contaminated with a white deposit comprising ionic flux residues. The degree of contamination of the cleaned boards was assessed using the Omega Meter.

TABLE 1

Composition of Solvent Mixture (% by weight)

| Time (hours) | Cleaning Compartment | | | Rinsing Compartment | | |
|---|---|---|---|---|---|---|
| | EtOH | iBuOH | GLYCOL | EtOH | iBuOH | ETH. GLY-COL |
| 0 | 4.4 | 1.0 | 1.0 | 4.4 | 1.0 | 1.0 |
| 33 | 6.7 | 3.3 | 4.2 | 2.7 | 0.15 | 0 |
| 82 | 7.0 | 3.5 | 4.4 | — | — | — |
| 160 | 7.9 | 4.2 | 3.8 | 3.6 | 0.20 | 0 |

TABLE 2

| Time (hours) | Ionic Residues on Cleaned Boards (mg/square inch NaCl) |
|---|---|
| 0 | 0.018 |
| 33 | 0.018 |
| 82 | 0.013 |
| 160 | 0.014 |
| Comparison | 0.027 |

EXAMPLE 2

Printed circuit boards prepared using Fry's R8 flux were cleaned as described in Example 1 except that the composition placed in the cleaning and rinsing compartment of the tank consisted of 1,1,2-trichloro-1,2,2-trifluoroethane (91.55%) industrial ethyl alcohol (4.4%), n-hexyl alcohol (2%), 1,1,1-tri(hydroxymethyl)propane (2%) and nitromethane (0.05%). The cleaned boards displayed no visible evidence of contamination and were found in the Omega Meter test to have on them only 0.014 mg/square inch NaCl of ionic flux residues. By way of comparison boards cleaned in the azeotropic mixture of 1,1,2-trichloro-1,2,2-trifluoroethane and ethyl alcohol had on them 0.027 mg/square inch NaCl of ionic flux residues.

EXAMPLE 3

Printed circuit boards prepared using Fry's R8 flux were cleaned as described in Example 1 except that the composition placed in the cleaning and rinsing compartments of the tank consisted of 1,1,2-trichloro-1,2,2-trifluoroethane (91.45%), industrial ethyl alcohol (4.5%), isobutyl alcohol (2%), ethylene glycol (2%) and nitromethane (0.05%). The cleaning boards displayed no evidence of contamination and were found using the Omega meter to have on them only 0.017 mg/square inch NaCl of ionic flux residues. By way of comparison, boards cleaned using the azeotropic mixture of 1,1,2-trichloro-1,2,2-trifluoroethane and ethyl alcohol had on them 0.027 mg/square inch NaCl of ionic flux residues.

I claim:

1. A cleaning composition comprising 1,1,2-trichloro-1,2,2-trifluoroethane and a monohydric lower aliphatic alcohol having from 1 to 3 carbon atoms and containing additives and which boils within ±2° C. of the boiling point of the azeotropic mixture of the 1,1,2-trichlor-1,2,2-trifluoroethane and the aliphatic alcohol having from 1 to 3 carbon atoms, the additives each being present in an amount of from 0.5 to 4% by weight and being a monohydric aliphatic alcohol having from 4 to 6 carbon atoms and ethylene glycol.

2. A cleaning composition as claimed in claim 1 wherein the amount of the alcohol having from 4 to 6 carbon atoms is from 0.5% to 4% by weight of the composition.

3. A cleaning composition as claimed in claim 1 wherein the amount of the ethylene glycol is from 0.5% to 4% by weight of the composition.

4. A cleaning composition as claimed in claim 1 wherein the alcohol having from 4 to 6 carbon atoms is isobutyl alcohol.

5. A cleaning composition as claimed in claim 1 which also contains a nitroalkane.

6. A method of cleaning contaminated articles which comprises bringing the articles into contact with a cleaning composition as claimed in claim 1.

7. A method as claimed in claim 6 wherein after cleaning the articles are rinsed with a composition comprising 1,1,2-trichloro-1,2,2-trifluoroethane.

8. A method as claimed in claim 6 or 7 wherein the cleaning composition is employed at the boil.

9. A method for the removal of water from articles which comprises bringing the articles into contact with a composition as claimed in claim 1.

* * * * *